LIGHT EMITTING HETEROJUNCTION SEMICONDUCTOR DEVICES

Filed Sept. 1, 1967

INVENTORS
WILLIAM I. LEHRER
HERBERT KROEMER
BY Gordon K. Telfer
ATTORNEY 3,488,542
Patented Jan. 6, 1970

3,488,542

LIGHT EMITTING HETEROJUNCTION SEMICONDUCTOR DEVICES

William I. Lehrer, 1161 Seena Ave., Los Altos, Calif. 94022, and Herbert Kroemer, 1010 Trinity Drive, Menlo Park, Calif. 94025

Filed Sept. 1, 1967, Ser. No. 665,029
Int. Cl. H01l *3/12*
U.S. Cl. 313—108 2 Claims

ABSTRACT OF THE DISCLOSURE

A heterojunction light emitting structure is disclosed that utilizes a PN junction in a semiconductor material such as silicon to cause acceleration of carriers into a layer of a different semiconductor material having a wider bandgap and exhibiting radiative recombination.

BACKGROUND OF THE INVENTION

Field of the invention

This invention relates generally to semiconductor devices having light emitting properties.

Description of the prior art

There have previously been disclosed light emitting semiconductor devices utilizing a material such as gallium arsenide with a PN junction in order to inject carriers from one side to the other of the junction to produce electromagnetic radiation by radiative recombination. Further description of such devices may be found in Burns et al. Patent 3,265,990, Aug. 9, 1966. Such devices have been known to produce radiation with high efficiency but the materials in which this is possible, such as gallium arsenide, are very difficult materials in which to provide a suitable PN junction. Such structures have been generally limited to light sources of relatively small area because of the difficulties in producing larger junction structures.

Light-emitting structures in silicon are more attractive from fabrication standpoint. However, light generation in silicon is an inefficient process and considerably higher voltages are required. Consequently, semiconductor light sources are not available with the combined qualities of ease of fabrication, large area, and the ability to form light emitting patterns.

Another known class of devices are heterojunction transistors that include base and collector regions in a conventional semiconductor material such as germanium, with an emitter region on the base of a wider bandgap material, such as gallium arsenide, in order to achieve better carrier injection and an improved transistor amplification factor. Such devices do not utilize the wider bandgap material for radiative recombination. The nature of the heterojunction in such devices is relatively critical, resulting in series problems in fabrication.

The principal objects of this invention are to provide semiconductor light emitting structures that do not encounter the serious fabrication difficulties of known types of light emitting diodes nor of known types of heterojunction devices.

SUMMARY OF THE INVENTION

The purposes of this invention are achieved through the use of a monocrystalline body of conventional, relatively low bandgap semiconductor material, such as silicon, in which is provided a shallow PN junction over which is disposed a layer of light emitting semiconductor material such as gallium arsenide. Application of a reverse bias across the PN junction in the monocrystalline body accelerates carriers which upon entering the light emitting layer produce light by radiative recombination.

This structure may be made using only state of the art techniques since the fabrication of suitable junctions in silicon is well known and the layer of light emitting material forming the heterojunction need not be as perfect as required in heterojunction transistors. The light emitting layer may, in fact, be of polycrystalline material having, however, some crystalline relation with the structure of the monocrystalline body in directions normal to the plane of the layer.

Application of a voltage across the junction, as by applying a reverse bias to contact on the lower semiconductor region and on the light emitting layer, causes carries in the silicon to be accelerated to energies that are large enough to enter either the conduction or the valence band of the wider bandgap light emitting layer where they recombine with opposite type carriers and emit radiation. In some embodiments the larger light intensities can be modulated by the addition of another junction in side the silicon body with an additional electrode so that the additional junction may be forward biased to provide larger numbers of carriers for acceleration into the light emitting layer.

The ability to selectively place impurities into silicon makes it possible to form the reverse biased junction in any particular configuration desired, so that a light source of a particular pattern may be provided. Furthermore, the silicon may include other active and/or passive elements to provide a semiconductor integrated circuit with radiative output. It is also the case that the silicon serves as a good reflectant surface for the radiation produced in the light emitting layer.

DESCRIPTION OF THE PREFERRED EMDODIMENTS

Figure 1:
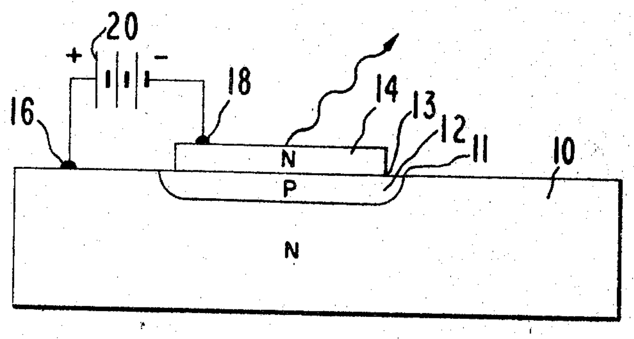
FIG. 1 is a cross-sectional view of one embodiment of the present invention.

Referring now to FIG. 1 there is shown a body of monocrystalline semiconductive material including first and second adjacent regions 10 and 12 of opposite conductivity type defining a PN junction 11 therebetween. In this embodiment the first region is of N type conductivity although it will be understood that structures of opposite polarity may also be formed. On the surface of the second region 12 is a layer 14 of light emitting semiconductive material that is of a different semiconductor than the monocrystalline body and hence forms a heterojunction 13 therewith. The light emitting layer is of the same conductivity type as the first region 10.

The structure also includes ohmic contacts 16 and 18 on opposite sides of PN junction 11 so that a reverse bias may be applied as by potential source 20, to accelerate carriers from the first region 10 across the second region 12 into the light emitting layer 14 causing radiative recombination.

The body of monocrystalline semiconductive material in which the first and second regions 10 and 12 are disposed is selected of a material in which a shallow junction may be readily formed and hence is preferably of silicon. Another semiconductor material such as germanium could alternatively be used but would not offer as much flexibility in the formation of selective junction patterns. In fabrication of the structure the starting material may be, for example, of usual device quality monocrystalline silicon doped with an N type impurity to a relatively low resistivity such as about 1 ohm-centimeter to provide the first region 10. The second region 12 is produced therein by selective diffusion utilizing a diffusion mask formed by well-known photolithographic techniques. The structures illustrated in the drawing omit for convenience the insulating surface passivation layer that, as is well-known, is preferably employed on the surface of the device, particularly over the junction termination. It is alternatively possible for the second region 12 to be formed by an epitaxial growth operation such as by forming a recess in a portion of the surface of the first region and depositing epitaxial material therein of opposite conductivity type.

The light emitting layer 14 is of one of the semiconductor compound materials having a wider bandgap than that of silicon which has been known to exhibit efficient radiative recombination. Preferred examples of the material for the light emitting layer are gallium arsenide, gallium phosphide, zinc sulfide, and zinc selenide. Various techniques are known for the deposition of such layers that would be suitable in the practice of this invention. For example, gallium arsenide may be deposited selectively through a window in an oxide layer over the second region by the vapor reaction of gallium and arsenic trichloride with an initial reaction temperature of from about 800 to 900° C. with reduction to about 750° C. at which gallium arsenide will deposit. An alternative method is vacuum deposition utilizing separate sources of gallium oxide ($Ga_2O_3$) and arsenic with the substrate at a temperature of about 550° C. at which single crystal gallium arsenide is formed. Similar techniques are suitable for the formation of other light emitting layers such as ZnS and ZnSe. The quality of the gallium arsenide, or other layer, is not nearly as critical as in prior heterojunction devices that rely on the gallium arsenide for its carrier injection qualities. Hence the deposition process need not be as carefully performed and the resulting layer, even if polycrystalline, is suitable so long as there is some crystalline continuity with the material of the monocrystalline body in the direction perpendicular to the plane of the layer. Dislocations at or near the heterojunction are tolerable. Thus the 4% difference in lattice constant between silicon and gallium arsenide is not prohibitive of a useful device although if intended as a heterojunction transistor good characteristics could not be obtained with such a mismatch. While the resistivity of the light emitting layer is not critical it is considered preferable that an impurity concentration of at least about $10^{14}$ atoms per cubic centimeter be present.

For maximum utilization of junction area it is preferred that the second region 12 be free of ohmic contact and that those contacts used in application of the reverse bias cross junction 11 be on the first region and the light emitting layer as illustrated in FIG. 1. Any of the known ohmic contact materials for silicon, in the case of contact 16, and for gallium arsenide, in the case of contact 18, may be employed in the present invention.

Figure 2:
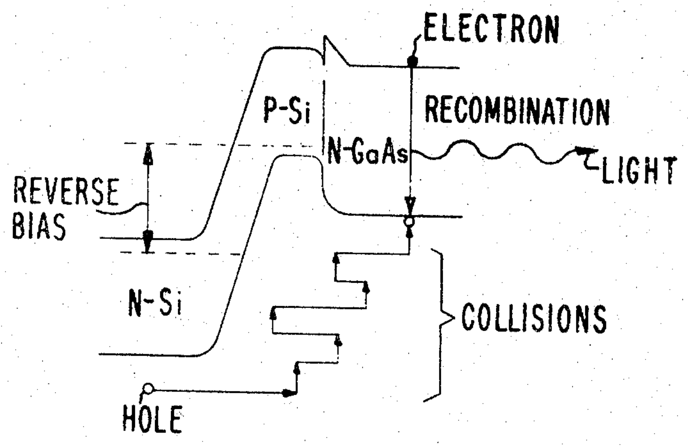
FIG. 2 is a potential energy diagram illustrative of the mechanism by which devices in accordance with this invention operate.

FIG. 2 illustrates an energy diagram for a device like that of FIG. 1 including the high barrier between the N and P type regions on opposite sides of the reverse biased junction. Holes, the minority carriers in the N type region 10, are accelerated by the applied reverse bias across the junction into the P type region 12 wherein numerous collisions may occur as illustrated but such carriers are of sufficient energy to reach the light emitting layer 14 where they recombine with conventional electrons with resultant light emission.

By way of further example, a suitable device like that of FIG. 1 may be fabricated by starting with a body of N type silicon doped with phosphorus to provide a substantially uniform resistivity of about 1 ohm-centimeter. The surface of the starting material is thermally oxidized and a window is formed in the oxide layer in the pattern desired for the second region 12 which is produced by the selective diffusion of an acceptor impurity such as boron to a shallow depth of less than about 1 micron and a surface concentration of about $10^{18}$ atoms per cubic centimeter. Following the impurity diffusion and reoxidation of the surface, a further window is opened over that portion of the surface of region 12 where the light emitting layer 14 is desired. Then by a technique such as the vapor reaction of gallium and arsenic trichloride described above, a layer of gallium arsenide is deposited over the surface and will assume some crystalline relationship with the exposed silicon surface while no deposition will take place on those portions of the surface covered by the oxide layer. The thickness of the light emitting layer may be about 1 micron or more. An aluminum contact is formed on the silicon and a contact of suitable metal such as tin is formed in the light emitting layer of gallium arsenide. A reverse bias potential of approximately 5 to 10 volts is applied across the structure resulting in a desired acceleration of carriers through the region 12 into the light emitting layer.

Figure 3:
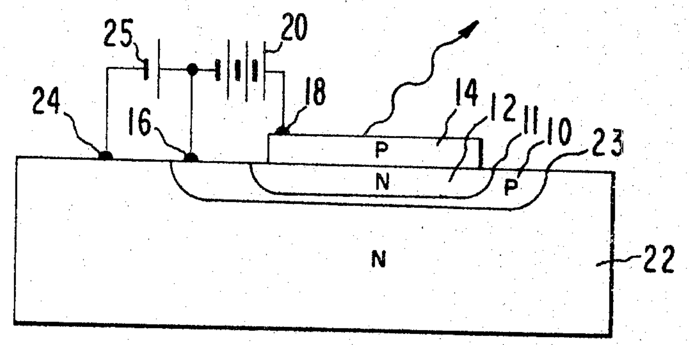
FIGS. 3 and 4 are cross-sectional views of other embodiments of the invention.

FIG. 3 illustrates a further embodiment of the present invention. For convenience like reference numerals are used as for the corresponding elements for FIG. 1 although the polarity of the structure is reversed. In this embodiment the first and second regions 10 and 12 are contained within the surface of a third region 22 of the body of monocrystalline material. Region 22 is of the same conductivity type as the second region 12 thus forming another PN junction 23. The PN junction 11 between regions 10 and 12 is, in operation, reverse biased by a source 20 as in FIG. 1. In addition, the junction 23 is forward biased by the application of a forward biasing potential from source 25 across contacts 16 and 24 on the first and third regions, respectively. In such a structure greater numbers of carriers, electrons for the polarity shown, can be accelerated across both the first and second regions 10 and 12 into the light emitting layer.

Other forms that the invention may take include those in which the reverse or forward bias potentials are controlled or generated by other electronic elements, some or all of which may be contained within the same monocrystalline body as regions 10, 12 and 22.

Figure 4:
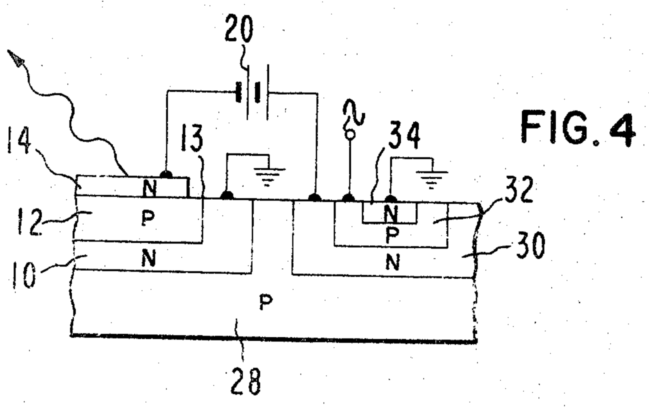

FIG. 4 illustrates an elementary form of a monolithic integrated circuit embodying the invention. In a unitary body of material, a light emitting structure (elements 10, 12 and 14 as in FIG. 1) is combined with a transistor having collector, base and emitter regions 30, 32 and 34, respectively. By known techniques the two portions of the structure may be simultaneously fabricated except for the diffusion of emitter region 34 and the deposition of light emitting layer 14. As illustrated, a signal may be applied to the base region 32 and amplified. The amplified signal may be used to modulate the reverse bias across junction 13. Naturally other active and/or passive elements may be provided for greater selectivity of performance.

A light emitting pattern may be chosen for any desired purpose. For example, a matrix of isolated light emitting elements may be contained within a unitary body which upon selective energization provide an alpha-numeric display.

While the present invention has been shown and described in a few forms only it will be apparent that various modifications may be made without departing from the spirit and scope thereof.

What we claim is:

1. A semiconductor light source comprising:

a body of monocrystalline silicon including first and second adjacent regions of opposite conductivity type defining a first PN junction, said second region being diffused into said first region to a thickness of less than 1 micron;

a layer of gallium arsenide formed on said second region of said silicon, said gallium arsenide possessing crystalline continuity with the underlying silicon material in the direction perpendicular to the plane of the interface between said gallium arsenide and said underlying silicon, said gallium arsenide possessing an impurity concentration of at least $10^{14}$ atoms per cubic centimeter of a type opposite to the type of impurity present in said underlying second region of silicon;

ohmic contacts to said first region and said layer; and a first bias potential source connected across the ohmic contacts on said first region and said layer of gallium arsenide to reverse bias the PN junction between said first and said second regions.

2. Structure as in claim 1 including a third region within said body of silicon adjacent said first region, said third region possessing a conductivity type opposite the conductivity type of said first region therefore to define a second PN junction with said first region;

an ohmic contact to said third region; and a second bias potential source connected across said ohmic contacts to said first and third regions to forward bias said second PN junction.

References Cited

UNITED STATES PATENTS

| | | | |
|---|---|---|---|
| 3,270,235 | 8/1966 | Loebner | 313—108 |
| 3,360,695 | 12/1967 | Lindmayer | 317—234 |
| 3,398,311 | 8/1968 | Page | 313—108 |

JAMES W. LAWRENCE, Primary Examiner

R. F. HOSSFELD, Assistant Examiner

U.S. Cl. X.R.

317—234